United States Patent
Nagata et al.

(10) Patent No.: US 9,837,139 B2
(45) Date of Patent: Dec. 5, 2017

(54) APPARATUS AND METHOD OF PRE-CHARGE AND EQUALIZATION CONTROL FOR DYNAMIC RANDOM ACCESS MEMORY

(71) Applicant: Micron Technology, Inc., Boise, ID (US)

(72) Inventors: Kyoichi Nagata, Tokyo (JP); Yuuji Motoyama, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/166,413

(22) Filed: Jan. 28, 2014

(65) Prior Publication Data

US 2014/0211545 A1    Jul. 31, 2014

(30) Foreign Application Priority Data

Jan. 31, 2013    (JP) .................................. 2013-016899

(51) Int. Cl.
  *G11C 11/4094*    (2006.01)
  *G11C 11/4076*    (2006.01)

(52) U.S. Cl.
  CPC ...... *G11C 11/4094* (2013.01); *G11C 11/4076* (2013.01)

(58) Field of Classification Search
  CPC . G11C 11/4094; G11C 11/4076; G11C 16/24; G11C 2029/1204; G11C 7/1096
  USPC ........................................................ 365/149
  See application file for complete search history.

(56) References Cited

U.S. PATENT DOCUMENTS

| | | | | |
|---|---|---|---|---|
| 5,036,492 A * | 7/1991 | Runaldue | ................. | G11C 7/12 365/202 |
| 5,432,744 A * | 7/1995 | Nagata | ................... | G11C 29/34 365/201 |
| 5,793,664 A * | 8/1998 | Nagata | ..................... | G11C 7/10 257/E27.085 |
| 5,886,936 A * | 3/1999 | Yang | ........................ | G11C 7/12 365/194 |
| 6,128,700 A * | 10/2000 | Hsu | ..................... | G06F 12/0855 711/105 |
| 6,141,275 A * | 10/2000 | Tsai | ..................... | G11C 7/1048 365/189.09 |
| 6,178,139 B1 * | 1/2001 | Hirobe | ................ | G11C 7/1066 365/230.04 |
| 6,205,068 B1 * | 3/2001 | Yoon | ....................... | G11C 7/12 365/203 |
| 6,297,999 B2 * | 10/2001 | Kato | ...................... | G11C 29/50 365/149 |
| 6,661,721 B2 * | 12/2003 | Lehmann | ................ | G11C 7/12 365/203 |

(Continued)

FOREIGN PATENT DOCUMENTS

JP    2002-117673 A    4/2002

*Primary Examiner* — Anthan Tran
*Assistant Examiner* — Mushfique Siddique
(74) *Attorney, Agent, or Firm* — Dorsey & Whitney LLP

(57) ABSTRACT

A semiconductor device includes an equalizing circuit and a control circuit. The equalizing circuit executes an operation of pre-charging the signal input/output line pair used for data inputting/outputting and an operation of equalizing it independently of each other. In case a plurality of data write operations occur in succession, the control circuit halts pre-charge control in the equalizing circuit in the course of consecutive write operations.

16 Claims, 11 Drawing Sheets

(56) References Cited

U.S. PATENT DOCUMENTS

| | | | | |
|---|---|---|---|---|
| 6,795,358 | B2* | 9/2004 | Tanaka | G11C 7/065 257/E21.656 |
| 7,245,549 | B2* | 7/2007 | Komura | G11C 11/4076 365/203 |
| 7,251,149 | B2* | 7/2007 | Sakamoto | G11C 7/1078 365/189.16 |
| 7,304,910 | B1* | 12/2007 | Hanzawa | G11C 7/1012 365/190 |
| 7,394,297 | B2* | 7/2008 | Nagata | H03K 19/0016 326/112 |
| 7,430,147 | B2* | 9/2008 | Kwack | G11C 7/1048 365/190 |
| 7,463,538 | B2* | 12/2008 | Shin | G11C 7/12 365/203 |
| 7,522,458 | B2* | 4/2009 | Sunaga | G11C 7/1078 365/191 |
| 7,660,183 | B2* | 2/2010 | Ware | G11C 5/14 365/230.03 |
| 7,929,367 | B2* | 4/2011 | Yoo | G11C 7/065 365/189.05 |
| 8,081,530 | B2* | 12/2011 | Chou | G11C 7/065 365/203 |
| 8,208,328 | B2* | 6/2012 | Hong | G11C 7/1048 365/189.11 |
| 8,223,568 | B2* | 7/2012 | Seo | G11C 5/025 365/194 |
| 8,400,855 | B2* | 3/2013 | Nakagawa | G11C 7/1048 365/203 |
| 8,621,291 | B2* | 12/2013 | Kinoshita | G11C 7/1006 714/711 |
| 8,830,770 | B2* | 9/2014 | Do | G11C 7/08 365/189.11 |
| 8,861,299 | B2* | 10/2014 | Nomoto | G11C 5/147 365/189.09 |
| 2001/0024382 | A1* | 9/2001 | Shimoyama | G11C 7/22 365/189.011 |
| 2004/0196692 | A1* | 10/2004 | Haraguchi | G11C 7/1078 365/155 |
| 2006/0104119 | A1* | 5/2006 | Ha | G11C 7/12 365/185.25 |
| 2006/0158924 | A1* | 7/2006 | Sekiguchi | G11C 7/12 365/149 |
| 2008/0002496 | A1* | 1/2008 | Kim | G11C 7/1048 365/203 |
| 2009/0016123 | A1* | 1/2009 | Yanagida | G11C 7/1006 365/191 |
| 2009/0086553 | A1* | 4/2009 | Lee | G11C 7/1006 365/189.08 |
| 2011/0032780 | A1* | 2/2011 | Teramoto | G11C 11/4076 365/189.18 |
| 2011/0044120 | A1* | 2/2011 | Nakagawa | G11C 7/1048 365/203 |
| 2011/0103123 | A1* | 5/2011 | Nakaoka | G11C 11/4074 365/63 |
| 2011/0176379 | A1* | 7/2011 | Takayama | G11C 11/4091 365/208 |
| 2011/0261639 | A1* | 10/2011 | Akiba | G11C 5/147 365/227 |
| 2012/0008446 | A1* | 1/2012 | Kim | G11C 7/1048 365/203 |
| 2012/0033506 | A1* | 2/2012 | Furutani | G11C 5/147 365/189.07 |
| 2014/0028280 | A1* | 1/2014 | Yamamoto | G05F 3/02 323/312 |
| 2015/0348628 | A1* | 12/2015 | Matsuoka | G11C 15/04 365/49.17 |

* cited by examiner

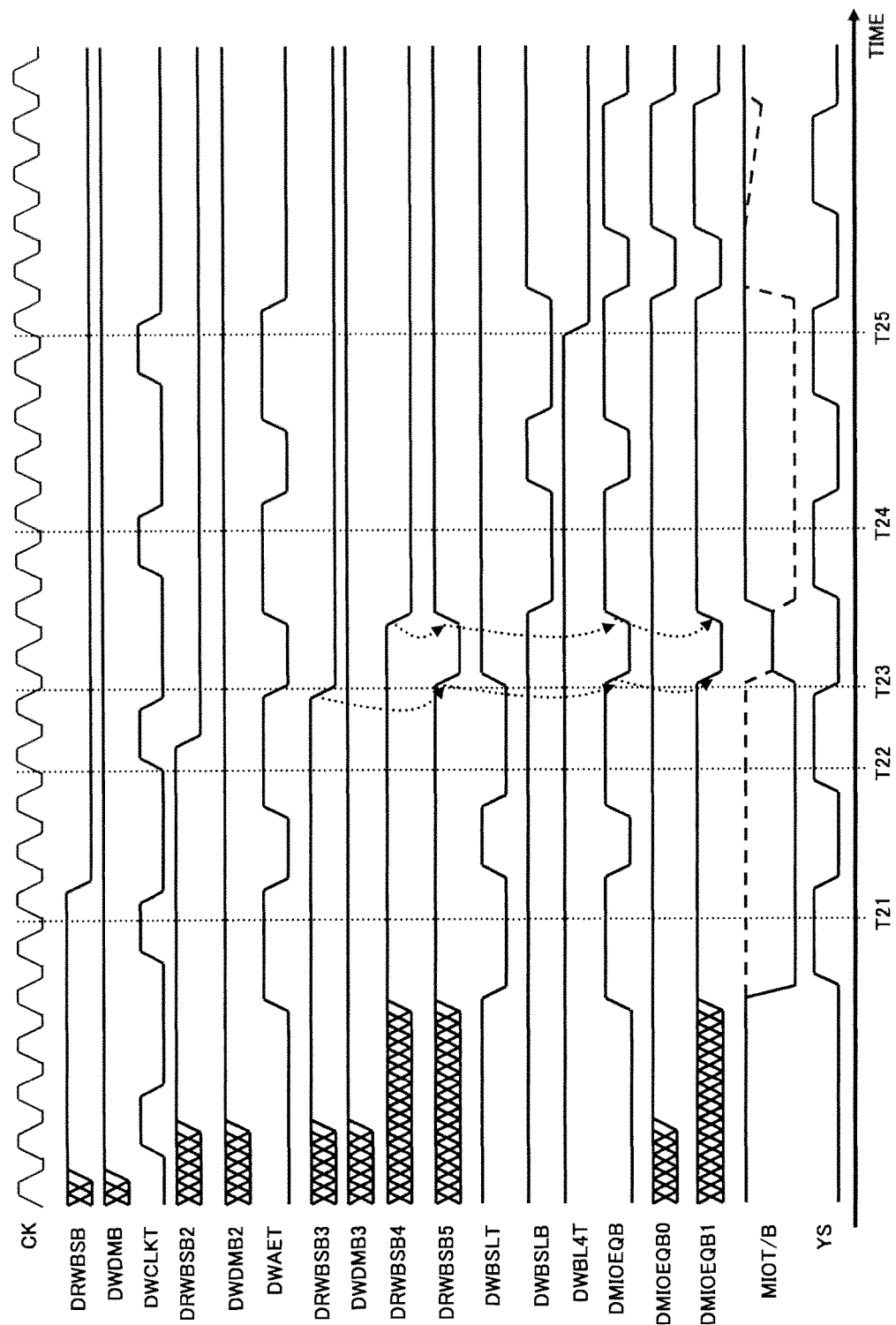

APPARATUS AND METHOD OF PRE-CHARGE AND EQUALIZATION CONTROL FOR DYNAMIC RANDOM ACCESS MEMORY

REFERENCE TO RELATED APPLICATION

This application is based upon and claims the benefit of priority of Japanese patent application No. 2013-016899 filed on Jan. 31, 2013, the disclosure of which is incorporated herein in its entirety by reference thereto.

TECHNICAL FIELD

This invention relates to a semiconductor device. More particularly, it relates to a semiconductor device that performs equalization of signal input/output lines.

BACKGROUND

In a DRAM (Dynamic Random Access Memory), there is a sustained demand for raising the operation frequency and lowering the power supply voltage. For example, the specifications required of the DDR (Double Data Rate) 2-800 standardized by the JEDEC (Joint Electron Device Engineering Council) are for a bus clock of 400 MHz and a power supply voltage of 1.8V. In contrast thereto, the specifications required of DDR3-1600, which is more advanced in generation, are for a bus clock of 800 MHz and a power supply voltage of 1.5V. To wit, in a DRAM, both a high operation frequency and a low power supply voltage are required in combination.

The background for such demand for realization of the speedup of the operation frequency and reduction in the power supply voltage is the need to remove difficulties accompanying the speedup of the operation of both the CPU (Central Processing Unit) and the memory bus. Moreover, if the speed of the memory bus is increased, the charge/discharge current for the memory bus is also increased, with the result that a need is felt for reducing the power supply voltage.

In JP Patent Kokai JP-A-2002-117673 (Patent Literature 1), there is disclosed a circuit that pre-charges a main input/output line MIO arranged between the write amplifier and the sense amplifier.

SUMMARY

The disclosure of the above mentioned related technical literature is to be incorporated herein by reference. The following analysis is by the present inventors.

As mentioned above, it is necessary with the DRAM to speed up the operation frequency and to lower the power supply voltage. There is also a need to reduce the size of the memory cell and hence the chip size as well as to increase the capacity. Under such situation, there are imposed limitations on reducing the internal voltage of the DRAM to a lower value.

As disclosed in FIG. 5 or otherwise of Patent Literature 1, precharge circuit, such as element LWMI of FIG. 5 of Patent Literature 1, is provided in a DRAM. With a DRAM, provided with such precharge circuit, one of the pair main input/output lines MIO is at a ground potential VSS during a time period within which data are written in succession. After the end of the time period, control is exercised to pre-charge the pair main input/output lines MIO to a preset potential. However, such control is beset with a problem that a marked voltage difference exists between the ground voltage VSS and the preset potential, thus increasing the charge/discharge current.

In a first aspect of the present invention, there is provided a semiconductor device including an equalizing circuit and a control circuit. The equalizing circuit is capable of performing pre-charge and equalization, independently of each other, for the signal input/output lines used for data inputting/outputting. In case data write operations occur in succession, the control circuit halts the pre-charge control in the equalizing circuit during consecutive write operations.

In a second aspect of the present invention, there is provided a semiconductor device including a first circuit, a second circuit and a control circuit. The first circuit short-circuits the signal input/output line pair used for data inputting/outputting, while the second circuit sets the signal input/output line pair at a preset potential. In case data write operations occur in succession, the control circuit deactivates the second circuit during consecutive data write operations.

BRIEF DESCRIPTION OF THE DRAWINGS

FIG. 11 is a timing chart showing an example operation of the semiconductor device 3.

PREFERRED MODES

An exemplary embodiment of the present disclosure will now be summarized hereinbelow. A semiconductor device includes an equalizing circuit (an equalizing circuit 101 shown in FIG. 1 as an example) and a control circuit (a write control circuit 30 of FIG. 2 and FIG. 3 as an example). The equalizing circuit independently performs pre-charge and equalization for signal input/output lines, for example, main input/output lines MIO, used for data inputting/outputting. On the other hand, if data write operations should occur in succession, the control circuit halts pre-charge control in the equalizing circuit during the consecutive write operations.

The semiconductor device executes pre-charge control and equalizing control for the signal input/output lines distinctly from each other. Moreover, when the data write operations occur in succession, the semiconductor device halts pre-charge control. By halting the pre-charge control in case the data write operations occur in succession, the potential at the signal input/output lines is not raised to a preset value, such as voltage VPERI, but may be set at an intermediate potential. As a consequence, the charge/discharge current at the signal input/output lines may be reduced to lower the current consumption during the consecutive write operations.

Figure 1:
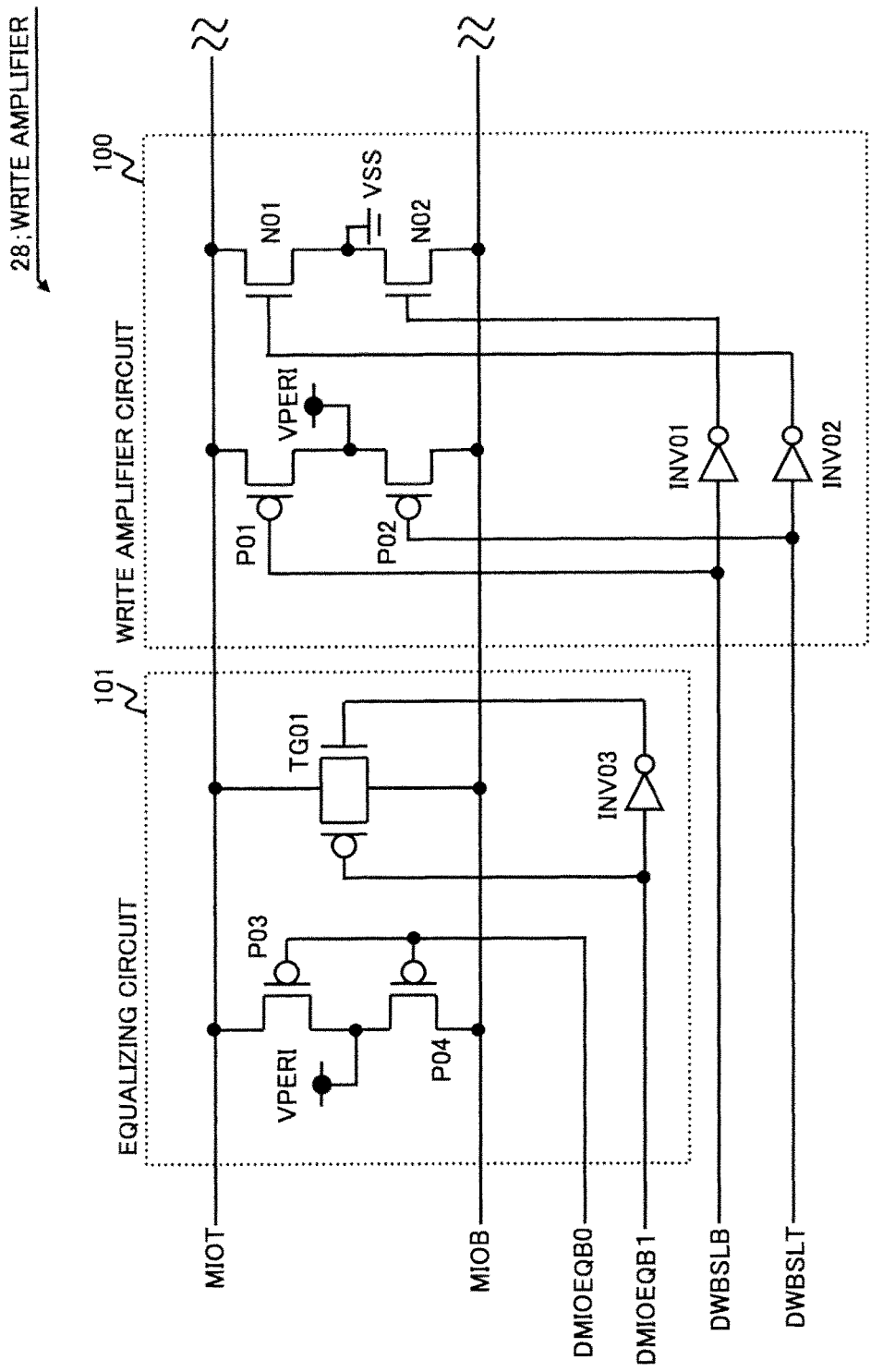
FIG. 1 is a circuit diagram showing an example internal configuration of a write amplifier 28 provided in a semiconductor device 1 according to an exemplary embodiment 1.
Figure 2:
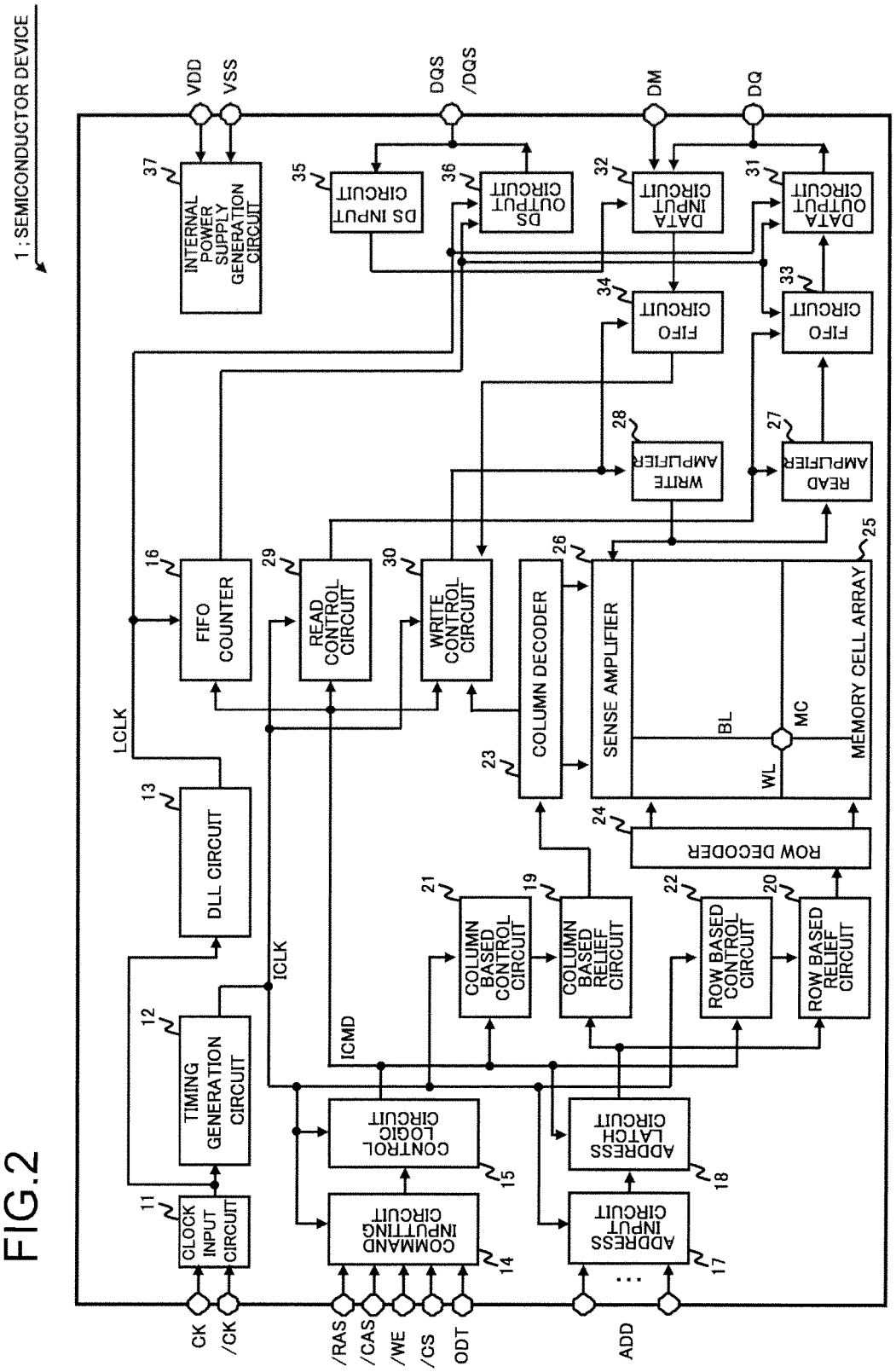
FIG. 2 is a circuit diagram showing a global configuration of a semiconductor device 1 according to the exemplary embodiment 1.
Figure 3:
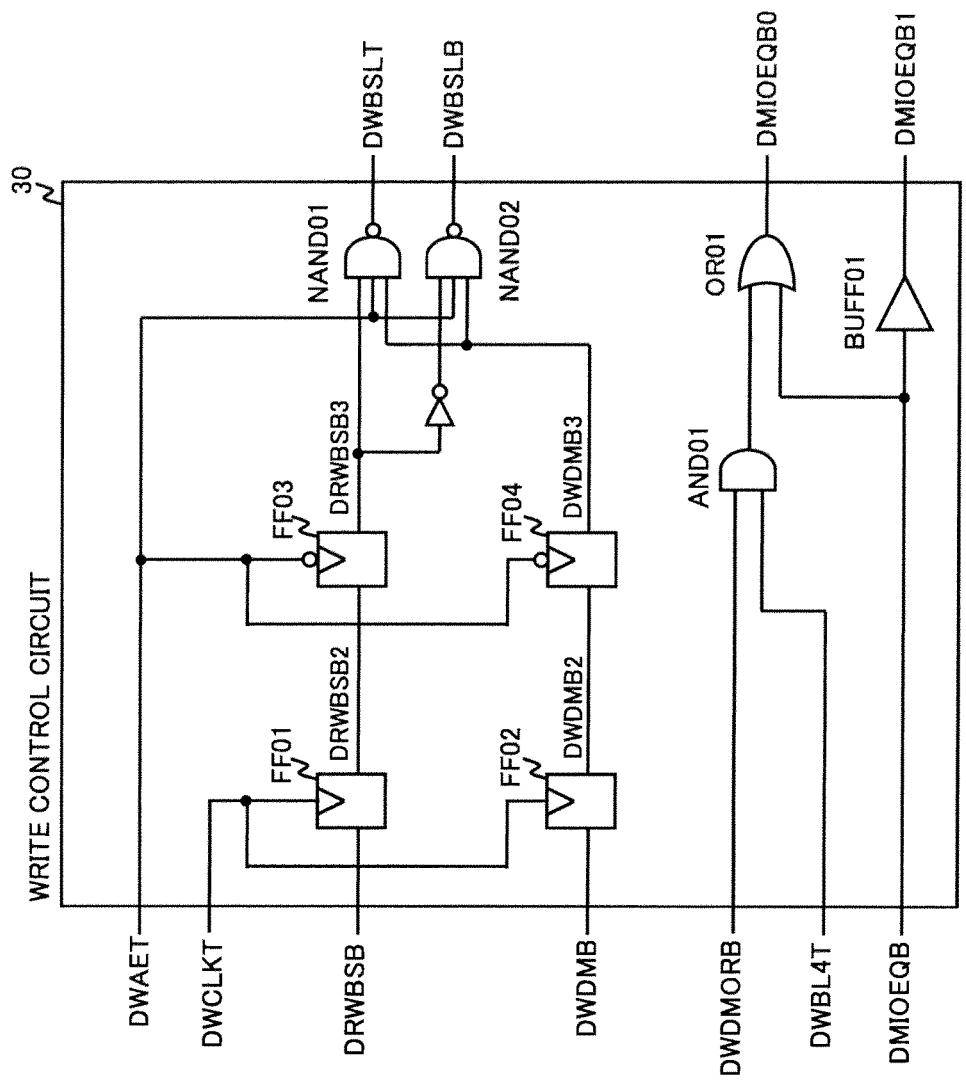
FIG. 3 is a circuit diagram showing an example internal configuration of a write control circuit 30.

In another exemplary embodiment, the semiconductor device includes a first circuit, such as a circuit including a transfer gate TG01 and an inverter circuit INV03 of FIG. 1, a second circuit, such as a circuit including P-channel MOS transistors PO3, PO4, and a control circuit, such as a write control circuit 30 of FIG. 2 and FIG. 3. The first circuit short-circuits the signal input/output line pair used for data inputting/outputting, and the second circuit sets the signal input/output line pair at a preset potential. The control circuit deactivates the second circuit during consecutive write operations in case data write operations occur in succession.

Certain preferred exemplary embodiments will now be described in detail with reference to the drawings.

[Exemplary Embodiment 1]

An exemplary embodiment 1 will be explained in detail with reference to the drawings.

FIG. 2 depicts an example global configuration of a semiconductor device 1 of the subject exemplary embodiment.

The semiconductor device 1 is a DDR3-SDRAM (Synchronous DRAM), and includes a terminal accepting clock signals (CK, /CK), and terminals accepting various command signals (/RAS, /CAS, /WE, /CS and ODT). The semiconductor device also includes a terminal used for inputting/outputting an address signal ADD, a terminal used for inputting/outputting read data DQ or write data DQ, a terminal accepting a data mask DM, a terminal accepting data strobe signals (DQS, /DQS) and a terminal fed with supply powers (VDD, VSS). Note that a signal name carrying a slash '/' mark at its leading end means that the signal is an inversion of a corresponding signal not carrying the slash mark, or is a low-active signal. For example, clock signals (CK, /CK) mean that the signals are complementary with respect to each other and that the write enable signal /WE denotes a low active signal.

The clock signals (CK, /CK) are delivered via a clock input circuit 11 to a timing generation circuit 12 and a DLL circuit 13. The timing generation circuit 12 generates an internal clock ICLK to deliver it to internal circuits to the exclusion of a circuit(s) relevant to data outputting. The DLL circuit 13 generates a clock for outputting LCLK and delivers it to the circuit(s) relevant to data outputting.

A command inputting circuit 14 accepts a row address strobe signal /RAS, a column address strobe signal /CAS, a write enable signal /WE, a chip select signal /CS and an on-die termination signal ODT. The signals accepted by the command inputting circuit 14 are output to a control logic circuit 15.

The control logic circuit 15 retains as well as decodes the command signals in synchronism with the internal clock ICLK. Results of decoding of the command signals by the control logic circuit 15 are delivered as internal commands ICMD to a variety of relevant internal circuits. Among the internal commands ICMD, output by the control logic circuit 15, there are a write operation control signal DWAET, a data mask control signal DWDMORB and a BL4 selection signal DWBL4T. The write operation control signal DWAET is such a control signal indicating that, when a write command is delivered from outside, the control logic circuit 15 is to instruct a write control circuit 30 to write data. The data mask control signal DWDMORB is such a control signal that is activated in case there is data mask for any of data delivered from outside at the time of a write operation. The BL4 selection signal DWBL4T is a signal notifying the presence/absence of BL4 setting. In the subject exemplary embodiment, if the BL4 selection signal DWBL4T is H in level, BL4 selection is valid (BL4 selection), whereas, if the signal DEBL4T is L in level, BL4 selection is not so (BL4 non-selection).

An FIFO counter 16 generates diverse timing signals whereby column-based respective circuit blocks will operate at preset timings after coming into being of a read command or a write command.

An address latch circuit 18 accepts an address signal ADD via an address input circuit 17. Further, the address latch circuit 18 delivers a column address and a row address of the address signal ADD received to a column based relief circuit 19 and to a row based relief circuit 20, respectively.

The column based relief circuit 19 is such a circuit that, in case a column address representing a failed bit line is delivered thereto, performs alternate accessing to a redundant bit line, without accessing the failed inherent hit line, thereby relieving the column address. The column based relief circuit 19 is controlled by a column based control circuit 21, and delivers its output signal to a column decoder 23.

The row based relief circuit 20 is such a circuit that, in ease a row address representing a failed word line is delivered thereto, performs alternate accessing to a redundant word line, without accessing the failed inherent word line, thereby relieving the row address. The row based relief circuit 20 is controlled by a row based control circuit 22, and delivers its output signal to a row decoder 24.

The row decoder 24 is such a circuit that selects one of word lines WL of a memory cell array 25. Referring to FIG. 2, in the memory cell array 25, a plurality of bit lines BL intersect a word line WL. A memory cell MC is disposed at an intersection of the word line WL and one of the bit lines BL. Note that, although FIG. 2 shows just the sole word line WL, the sole bit line BL and the sole memory cell MC, a plurality of the word lines WL, a plurality of the bit lines and a plurality of the memory cells are provided in actuality in the memory cell array 25. In addition, the bit lines BL are coupled to sense amplifiers 26 coordinated thereto.

The column decoder 23 is such a circuit that selects one of the sense amplifiers 26 in the memory cell array 25 based on a column address. Specifically, the column decoder 23 controls a Y switch selection signal YS to select the sense amplifier 26 matched to the column address. The sense amplifier 26 as selected by the column decoder 23 is coupled to a read amplifier 27 during the readout operation, while being coupled to a write amplifier 28 during the data write operation. Also, the column decoder 23 activates a main input/output line equalizing signal DMIOEQB from H level to L level when it becomes necessary to equalize and precharge the main input/output line pair (MIOT, MIOB). Note that the operation of the read amplifier 27 is controlled by a read control circuit 29, while that of the write amplifier 28 is controlled by the write control circuit 30.

A data output circuit 31 outputs the read data DQ, and a data input circuit 32 accepts the write data DQ and the data mask DM. The write data DQ and the data mask DM, accepted by the data input circuit 32, are respectively output as a write data signal DRWBSB and a data mask signal DWDMB to the write control circuit 30 via the FIFO counter 16.

The data output circuit 31 is coupled to the read amplifier 27 via a FIFO circuit 33. A plurality of read data DQ are pre-fetched and output in a burst fashion at a data input/output terminal. A data input circuit 32 is coupled via another FIFO circuit 34 to the write control circuit 30. The plurality of the write data DQ, entered in a burst fashion, are written simultaneously in the memory cell array 25.

A data strobe (DS) input circuit 35 and a data strobe output circuit 36 are circuits used respectively for inputting/outputting the data strobe signals (DQS, /DQS). An internal power supply generation circuit 37 receives supply powers (VDD, VSS) to generate a variety of internal power supplies.

FIG. 3 depicts an example internal configuration of the write control circuit 30. The write control circuit 30 includes four flipflops FF01 to FF04, two NAND circuits NAND01, NAND2, an AND circuit AND01, an OR circuit OR01 and a buffer circuit BUFF01.

The write control circuit 30 accepts the write data signal DRWBSB and the data mask signal DWDMB via the data input circuit 32 and the FIFO circuit 34. The write control circuit 30 also accepts the write operation control signal DWAET, data mask control signal DWDMORB and the BL4 selection signal DWBL4T from the control logic circuit 15.

The write control circuit 30 accepts the main input/output line equalizing signal DMIOEQB from the column decoder 23, while accepting a tinning signal DWCLKT from the timing generation circuit 12. The write control circuit 30 outputs write data signals (DWBSLT, DWBSLB), relatively complementary to each other, and a pre-charge control signal DMIOEQB0 as well as an equalizing control signal DMIOEQB1 to the write amplifier 28. The write control circuit 30 generates the write data signals (DWBSLT, DWBSLB), relatively complementary to each other, based on the write data signal DRWBSB. The write data signals (DWBSLT, DWBSLB) drive the main input/output line pair (MIOT, MIOB), coupled to the memory cell MC, via the write amplifier 28. It is noted that the write data signals, output by the flipflops FF01, FF03, are labeled DRWBSB2, DRWBSB3, respectively, and that, in like manner, the write data signals, output by the flipflops FF02, FF04, are labeled DWDMB2, DWDMB3, respectively.

FIG. 1 shows an example internal configuration of the write amplifier 28, which write amplifier 28 is made up of a write amplifier circuit 100 and an equalizing circuit 101. The input/output line pair (MIOT, MIOB), shown in FIG. 1, is coupled to the memory cell MC via the sense amplifier 26 disposed within the memory cell array 25. In other words, the semiconductor device 1 uses a main input/output line MIO (signal input/output line) for data inputting/outputting.

The write amplifier circuit 100 is made up of P-channel MOS transistors P01, P02, N-channel MOS transistors N01, N02 and inverter circuits INV01, INV02.

The equalizing circuit 101 is made up of P-channel MOS transistors P03. P04, an inverter circuit INV03 and a transfer gate TG01.

The write amplifier circuit 100 drives the main input/output line pair (MIOT, MIOB) to logical levels consistent with the write data signals (DWBSLT, DWBSLB) delivered from the write control circuit 30. For example, if the write data signal DWBSLT is H in level and the write data signal DWBSLB is L in level, the main input/output line MIOT is driven to the voltage VPERI, while the main input/output line MIOB is driven to the voltage VSS. Or, if the write data signal DWBSLT is L in level and the write data signal DWBSLB is H in level, the main input/output line MIOT is driven to the voltage VSS, while the main input/output line M1013 is driven to the voltage VPERI.

The equalizing circuit 101 pre-charges and equalizes the main input/output line pair MIOT, MIOB, based on the pre-charge control signal DMIOEQB0 and the equalizing control signal DMIOEQB1 delivered from the write control circuit 30. More specifically, the equalizing circuit 101 short-circuits the main input/output line pair MIOT, MIOB, based on the equalizing control signal DMIOEQB1, while setting the potential of the main input/output line pair MIOT, MIOB so as to be substantially equal to the voltage VPERI, based on the preehcarge control signal DMIOEQB0. In this manner, the equalizing circuit 101 is capable of independently pre-charging and equalizing the main input/output line pair MIOT, MIOB. In case of performing consecutive write operations, the main input/output line pair MIOT, MIOB is not pre-charged, as will be set out in detail subsequently.

Figure 4:
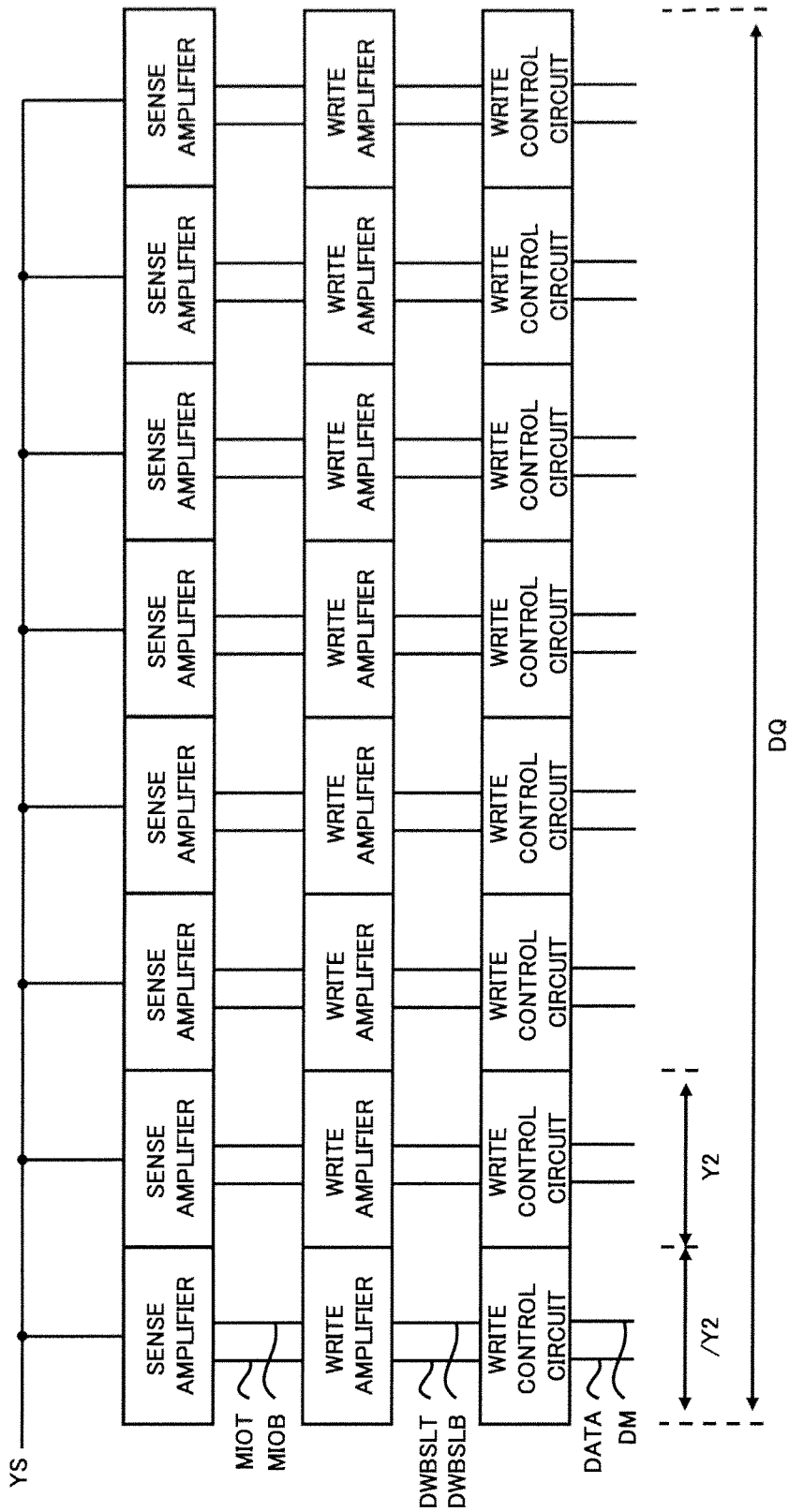
FIG. 4 is a diagram for illustrating allocation of 8-bit data.

In the DDR3-SDRAM, 8-hit data are allocated to a sole Y switch selection signal YS by 8-bit pre-fetch (see FIG. 4). Thus, one write amplifier 28 and one write control circuit 30 are provided for each bit. On the other hand, since the sole Y-switch selection signal YS is used in common, switching between BL4 selection and BL4 non-selection is controlled in response to an internal address Y2. More specifically, the control logic circuit 15 switches between BL4 selection and BL4 non-selection by activation/deactivation of the write operation control signal DWAET.

Figure 5:
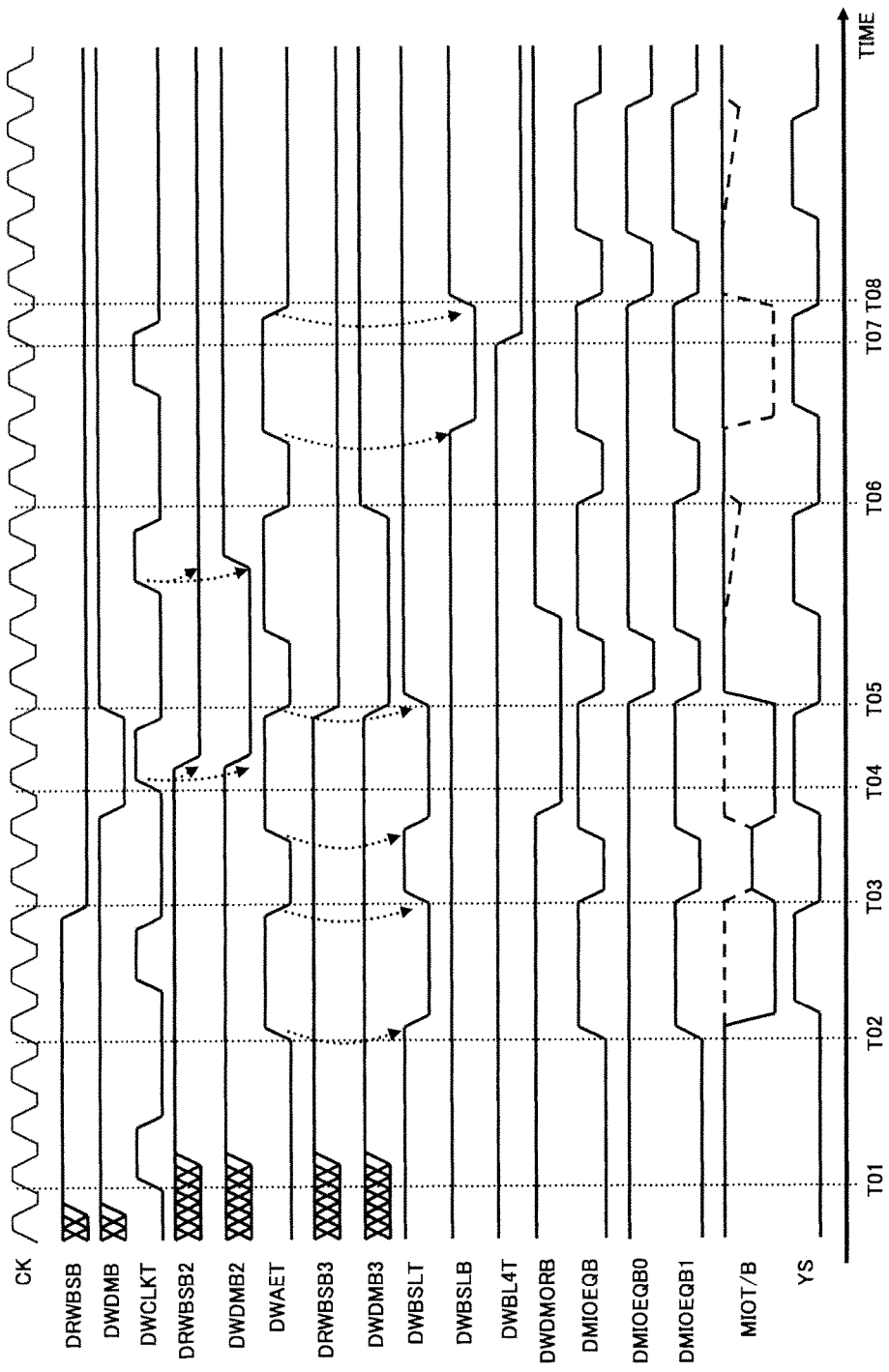
FIG. 5 is a timing chart showing an example operation of a semiconductor device 1.

The operation of the semiconductor device 1 will now be explained. FIG. 5 depicts an example operation of the semiconductor device 1 according to the subject exemplary embodiment.

Referring to FIG. 5, the write data signal DRWBSB is latched by the flipflop FF01, in response to the timing signal DWCLKT shifting at a time point T01 from the L level to the H level, and is output as write data signal DRWBSB2. The write data signal DRWBSB2, in turn, is latched by the flipflop FF03 in response to the write operation control signal DWAET, activated by the control logic circuit 15 having received the write commend, and is output as write data signal DRWBSB3 (at a time point T02).

As a consequence, the write data signal DWBSLT shifts to the L level, while the write data signal DWBSLB shifts to the H level, thus driving the main input/output line pair MIOT, MIOB (at the time point T02). Also, at the time point T02, the column decoder 23 deactivates the main input/output line equalizing signal DMIOEQB. Since the main input/output line equalizing signal DMIOEQB shifts from the L level to the H level, the equalizing control signal DMIOEQB1 also shifts from the L level to the H level, as a result of which the pair main input/output lines MIOT, MIOB are isolated from each other (the transfer gate TG01 being turned off).

On the other hand, at the time point T02, both the data mask control signal DWDMORB and the BL4 selection signal DWBL4T are at H level, so that the pre-charge control signal DMIOEQB0 is H in level. Since the pre-charge control signal DMIOEQB0 is at the H level, pre-charge control by the equalizing circuit 101 is not executed (pre-charge control is halted).

At a time point T03, the write operation control signal DWAET shifts to the L level. Moreover, with the end of the control for the write operation, the column decoder 23 activates the main input/output line equalizing signal DMI-OEQB (i.e., shifts the signal to the L level). In response to the main input/output line equalizing signal DMIOEQB thus shifting to the L level, the equalizing control signal DMI-OEQB1 also shifts to the L level. However, the pre-charge control signal DMIOEQB0 keeps on being at H level. As a consequence, the pair main input/output lines MIOT. MIOB are short-circuited by the transfer gate TG01, but are not pre-charged to the voltage VPERI. That is, the main input/output line pair MIOT, MIOB shares the voltage and shifts to an intermediate potential. Thereafter, the control for the write operation is re-initiated, and the consecutive write operations cease at a time point T05.

In this manner, in the semiconductor device 1 according to the subject exemplary embodiment, the main input/output line equalizing signal DMIOEQB, controlling the equalizing circuit 101, is separated into the two control signals (DMIOEQB0 and DMIOEQB1). By separating the main input/output line equalizing signal DMIOEQB into the two control signals, it becomes possible to halt the pre-charge control at the time of end of each write operation in the course of the consecutive write operations. By haling the pre-charge control, it is possible to suppress unneeded charge/discharge currents in the main input/output line pair MIOT, MIOB.

On the other hand, since the semiconductor device 1 has to operate as the DDR3-SDRAM, the write operation has to be stopped on accepting the data mask DM. In like manner, the write operation for the lower 4 bits has to be stopped at the time of BL4 non-selection. That is, at the time of the BL4 non-selection, such control needs to be exercised in which a certain one(s) of hits of the write data, made up of a plurality of hits, is not written in the memory cell MC.

Referring to FIG. 5, the L-level data mask signal DWDMB remains latched at a time point T04 by the flipflop FF02. Since the L level data mask signal DWDMB has now been entered, both the write data signals DWBSLT, DWB-SLB go high in level, thus halting the write operation.

On the other hand, at a time point 105, the data mask control signal DWDMORB is already L in level. Thus, the pre-charge control signal DMIOEQB0 is responsive to activation of the main input/output line equalizing signal DMI-OEQB to shift to the L level to manage pre-charge control. In this manner, during the data masking, pre-charge control and equalizing control for the main input/output line pair MIOT, MIOB are managed by the equalizing circuit 101. As a consequence, the main input/output line pair MIOT, MIOB is set at the voltage VPERI such as to prevent data destruction during the data masking. Also, at a time point T06, the data mask control signal DWDMORB has already shifted from the L level to the H level, such that the data masking has been canceled. With the data masking thus canceled, the main input/output line equalizing signal DMIOEQB is activated, that is, shifts to the L level, whereby the equalizing control signal DMIOEQB 1 also shifts to the L level. However, the pre-charge control signal DMIOEQB0 keeps on being in the H level. As a consequence, the main input/output line pair MIOT, MIOB is short-circuited by the transfer gate TG01 to perform equalizing control. However, the pre-charge control is not performed. It is noted that, since the potentials of the pair main input/output lines MIOT, MIOB are set at VPERI at the time point T05, the potentials of both the pair main input/output lines MIOT, MIOB are VPERI as the result of the equalizing control.

During the time of the BL4 non-selection, the write operation is not executed. However, at this time, pre-charge control is exercised to prevent data destruction. More specifically, during the time of BL4 non-selection, the BL4 selection signal DWBL4T shifts to the L level at a time point T07. Hence, the pre-charge control signal DMIOEQB0 shifts to the L level, in response to activation of the main input/output line equalizing signal DMIOEQI3, such as to effect pre-charge control (time point T08). In this manner, during the time of BL4 non-selection, pre-charge control and equalizing control for the main input/output line pair MIOT, MIOB are managed by the equalizing circuit 101, as a result of which the pair main input/output lines MIOT, MIOB are set at the voltage VPERI to prevent data destruction at the time of the BL4 non-selection.

To implement the operation as the DDR3-SDRAM, it is thus necessary for the semiconductor device 1 to implement the data masking operation as well as the BL4 non-select operation. Thus, the control signals indicative of these operating states (DWDMORB and DWBL4T) are used to implement the pre-charge and equalization at the time of the data masking operation and the BL4 non-selection.

Figure 6:
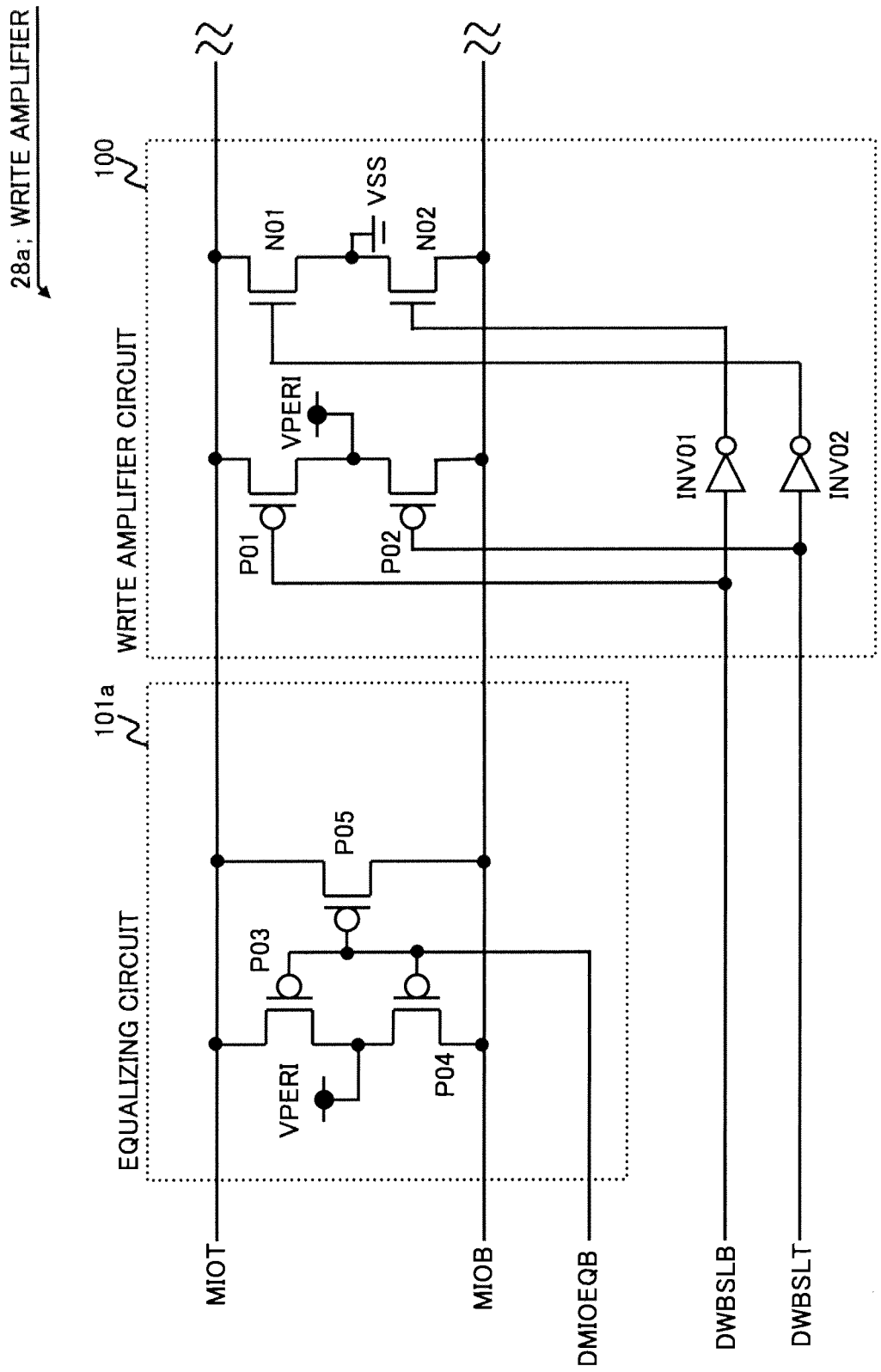
FIG. 6 is a circuit diagram showing an example internal configuration of a write amplifier.
Figure 7:
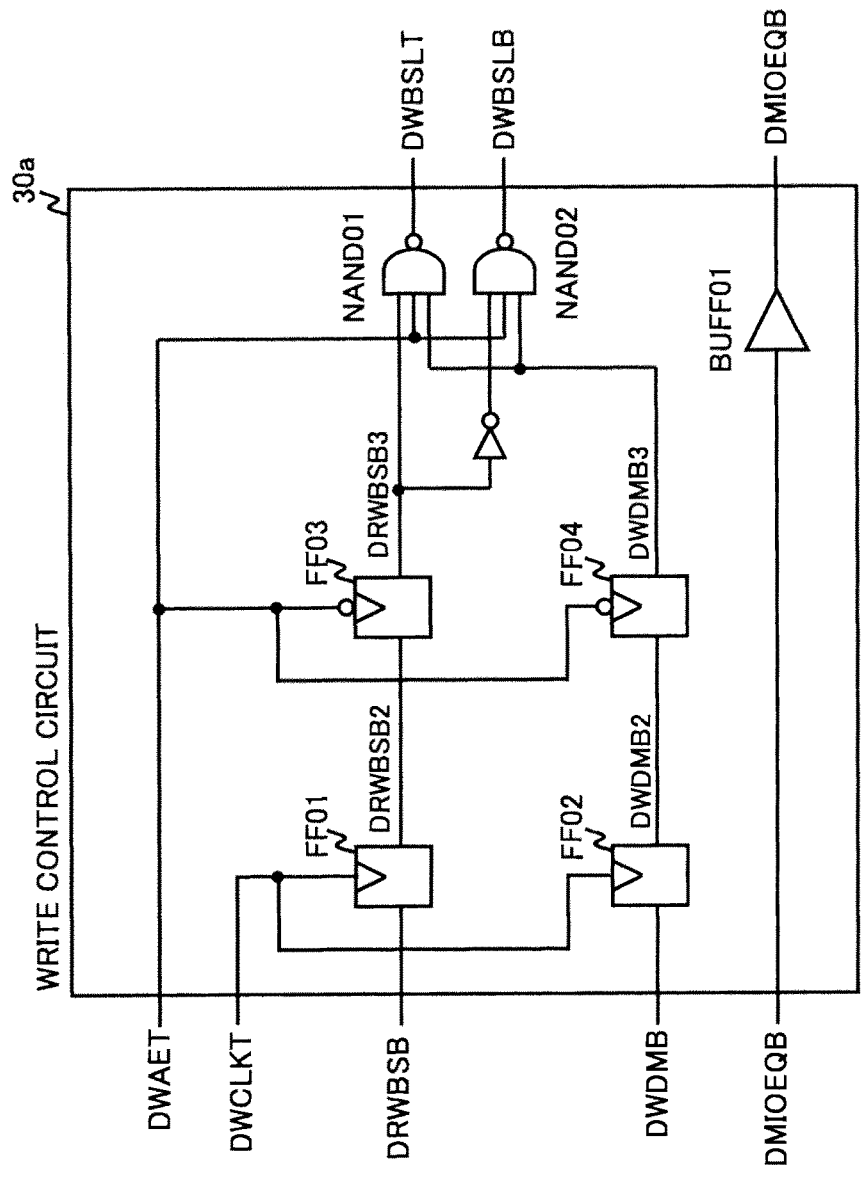
FIG. 7 is a circuit diagram showing an example internal configuration of a write control circuit.

Here, a case where the pre-charge control and the equalizing control are not separated from each other will be explained. It is now assumed that the write amplifier and the write control circuit are respectively formulated as shown in FIG. 6 and FIG. 7. Note that, in these figures, the same components as those shown in FIG. 1 and FIG. 3 are denoted by the same symbols and the corresponding explanation is dispensed with.

Figure 8:
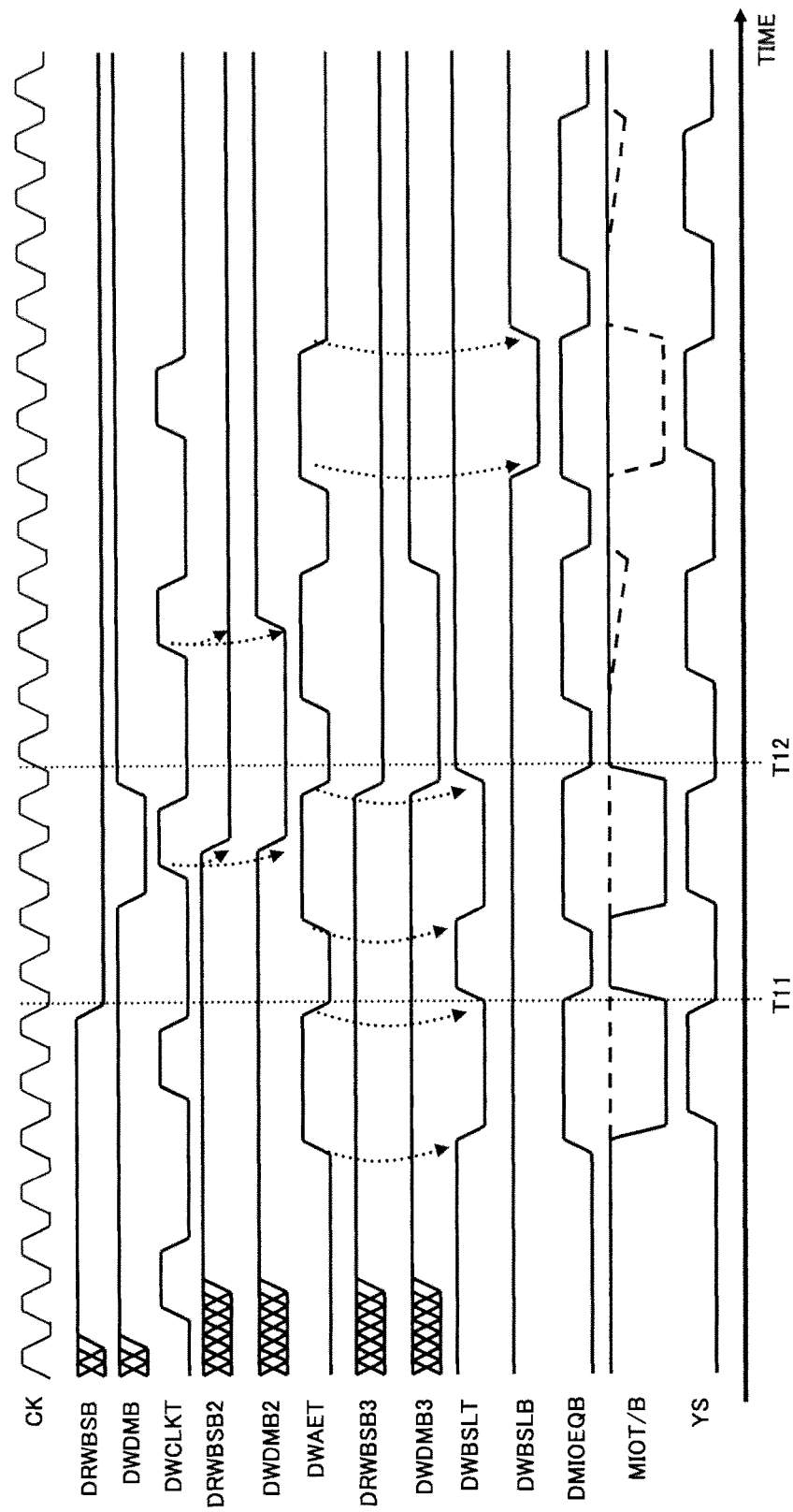
FIG. 8 is a timing chart showing an example operation of the write amplifier shown in FIG. 6 and the write control circuit shown in FIG. 7.

FIG. 8 depicts a timing chart showing an example operation of the write amplifier and the write control circuit respectively shown in FIG. 6 and FIG. 7. Referring to FIG. 8, in case such write amplifier and write control circuit are used, the pair main input/output lines MIOT, MIOB are pre-charged to the voltage VPERI each time the write operation is performed, as indicated at a time point T11 and a time point T12 as an example. However, during the time period of the write operations, the voltage at one of the pair main input/output lines MIOT, MIOB becomes equal to the voltage VSS. Thus, if the pair main input/output lines are subsequently pre-charged to the voltage VPERI, the charge/discharge currents on the pair main input/output lines MIOT, MIOB are increased.

On the other hand, in the semiconductor device 1 of the subject exemplary embodiment 1, the pre-charge control and the equalizing control are separated from each other and, during the consecutive write operations, the pre-charge control is halted and the equalizing control is executed. In this manner, electrical charges are shared by the pair main input/output lines MIOT, MIOB, which may thus be set at an intermediate potential. As a consequence, the charge/discharge current produced on the pair main input/output lines MIOT, MIOB may be suppressed to improve the performance of the semiconductor device 1. Moreover, by having each of the data mask control signal DWDMORB and the BL4 selection signal DWBL4T play the part in the pre-charge control, it is possible to implement the function desired of the DDR3-SDRAM.

[Exemplary Embodiment 2]

Next, the exemplary embodiment 2 will be explained in detail with reference to the drawings.

The data mask control signal DWDMORB in the semiconductor device 1 of the exemplary embodiment 1 is such a signal activated in case any one or more of the data being written during the write operations is masked. Hence, pre-charge control is managed even for the main input/output line pair MIOT, MIOB in which data masking is not applied during the write operations. There is thus room for reducing the charge/discharge current produced on the main input/output line pair MIOT, MIOB to lesser values.

It is noted that there is no difference between the global configuration of the semiconductor device 1 and that of a semiconductor device 2 of the subject exemplary embodiment. Hence the description of the semiconductor device 2 is dispensed with insofar as the description is relevant to that made with reference to FIG. 2.

Figure 9:
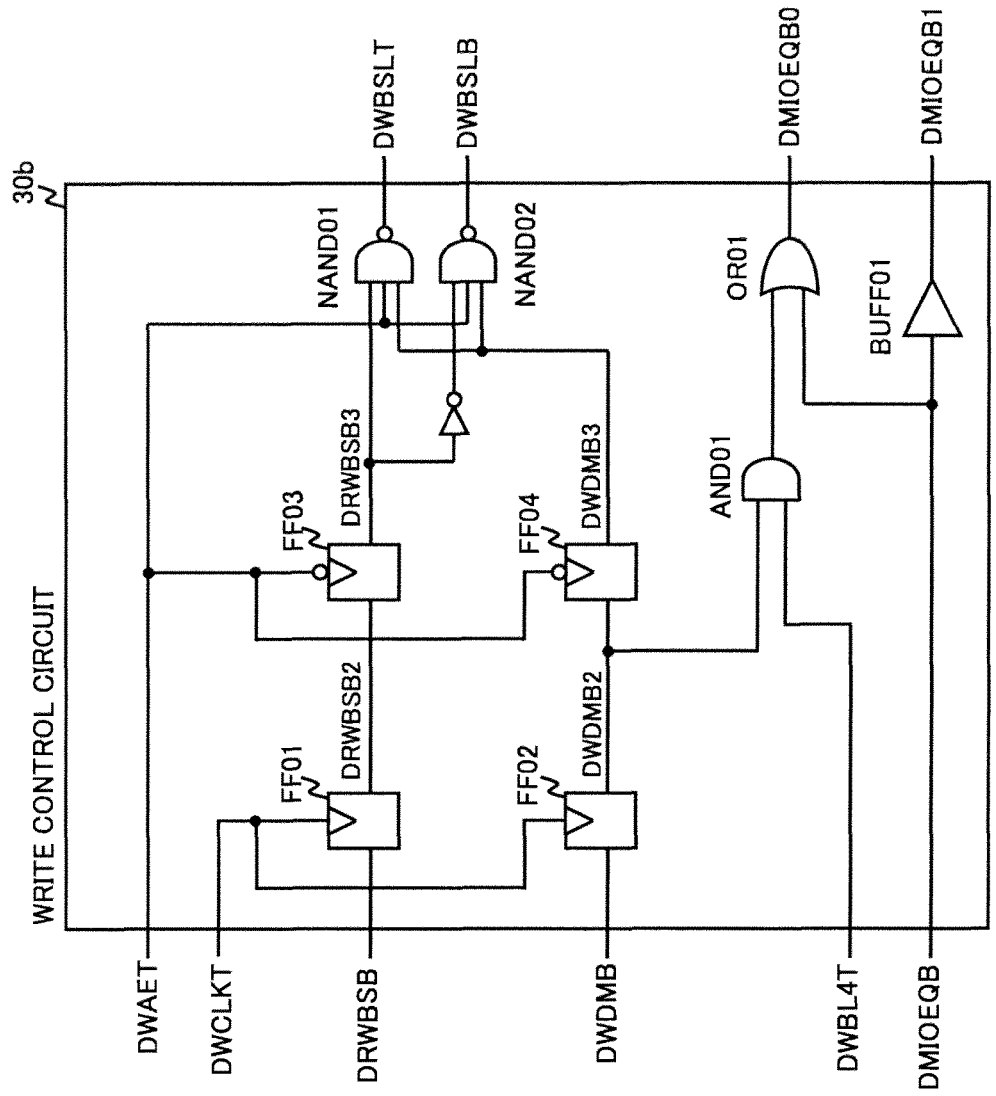
FIG. 9 is a circuit diagram showing an example internal configuration of a write control circuit 30b provided in a semiconductor device 2 according to an exemplary embodiment 2.

FIG. 9 shows an example internal configuration of a write control circuit 30*b* in the semiconductor device 2 according to the subject exemplary embodiment. In FIG. 9, the components which are the same as those shown in FIG. 3 are indicated by the same symbols and the corresponding description is dispensed with.

Referring to FIG. 9, the write control circuit 30*b* generates a pre-charge control signal DMIOEQB0 based on a logical level of a data mask signal DWDMB2. That is, in case the data mask signal DWDMB2 is L in level data masking needs to be executed. Hence, the pre-charge control signal DMIOEQB0 is set to the L level to perform pre-charge control.

If, on the other hand, the data mask signal DWDMB2 is H in level, data masking for the corresponding write data DQ is unnecessary. Hence, the pre-charge control signal DMIOEQB0 is set to the H level to halt pre-charge control. By halting the pre-charge control, it is possible to reduce the charge/discharge current on the main input/output line pair MIOT, MIOB to a lesser value.

In the semiconductor device 2 of the subject exemplary embodiment, described above, whether or not data masking is necessary for the write data DQ is determined on the hit-by-hit basis. Based on the result of the decision, whether or not pre-charge control is necessary is determined. This reduces the charge/discharge current on the main input/output line pair MIOT, MIOB.

[Exemplary Embodiment 3]

Next, an exemplary embodiment 3 will be explained in detail with reference to the drawings.

In the exemplary embodiments 1 and 2, equalization is carried out even if the write data DQ at hand is the same as the next following write data DQ. However, if the two data DQ are the same write data, it is unnecessary to equalize the pair main input/output lines MIOT, MIOB. That is, there is room for reducing the charge/discharge current on the pair main input/output lines MIOT, MIOB to a lesser value.

It is noted that, since there is no difference between the global configuration of the semiconductor device 1 and that of a semiconductor device 3 of the subject exemplary embodiment, the description of the semiconductor device 3 is dispensed with insofar as the description is relevant to the description made with reference to FIG. 2.

Figure 10:
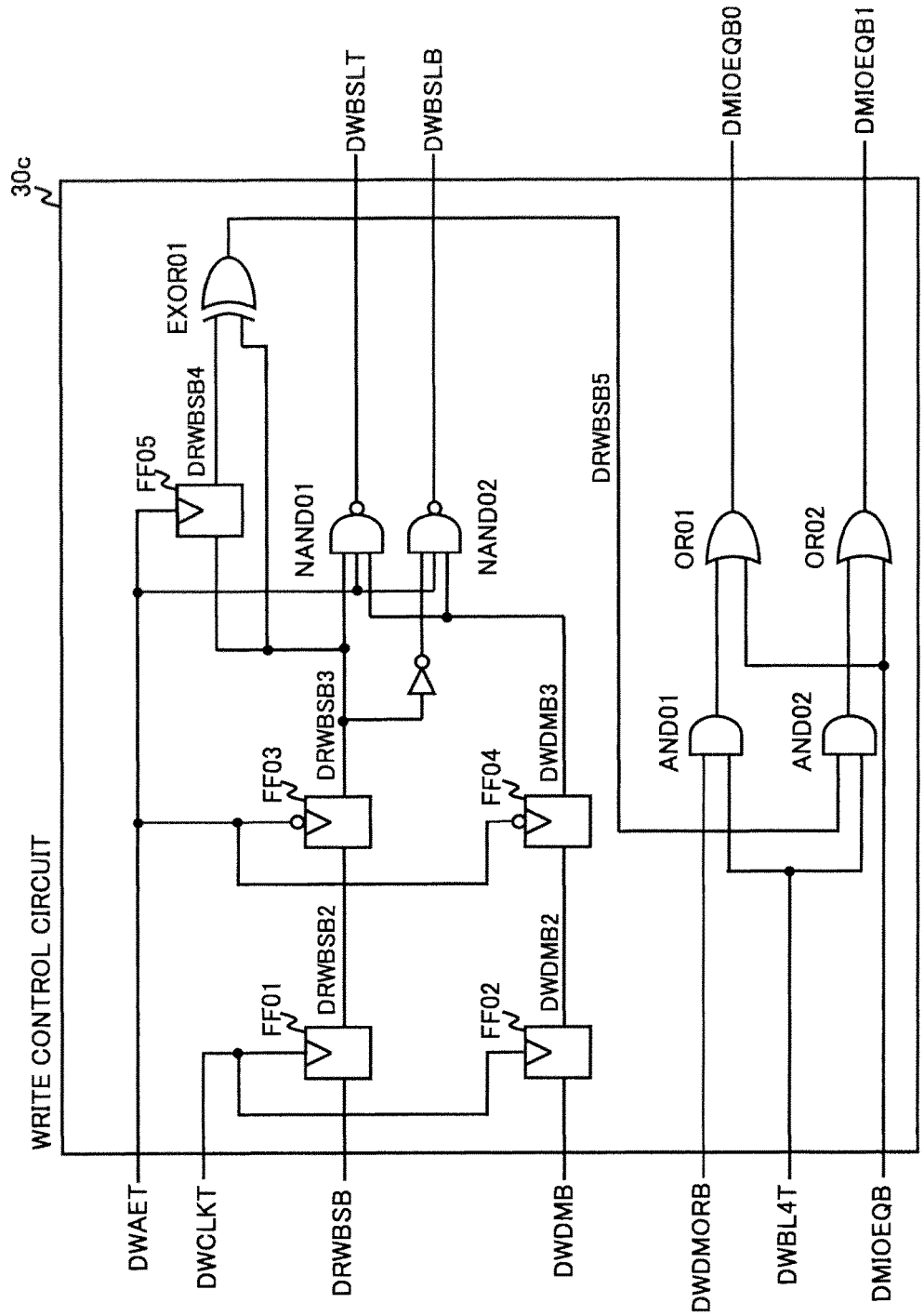
FIG. 10 is a circuit diagram showing an example internal configuration of a write control circuit 30c provided in a semiconductor device 3 according to an exemplary embodiment 3.

FIG. 10 shows an example internal configuration of a write control circuit 30*c* in the semiconductor device 3 according to the subject exemplary embodiment. In FIG. 10, the components which are the same as those shown in FIG. 3 are indicated by the same symbols and the corresponding description is dispensed with.

The write control circuit 30*c* differs from the write control circuit 30 in that the circuit 30*c* includes a data comparator circuit composed by a flipflop circuit FF05 and an exclusive-OR circuit EXOR01, and in that the equalizing control signal DMIOEQB1 is generated based on an output of the data comparator circuit.

The write control circuit 30*c* compares a write data DRWBSB3 to a write data signal DRWBSB4 directly following it. In case the two write data signals are of the same logical level, a comparison result signal DRWBSB5 of the H level is output. In case the two write data signals differ from each other in the logical level, a comparison result signal DRWBSB5 of the L level is output. An equalizing control signal DMIOEQB1, generated on the basis of the comparison result signal DRWBSB5, halts the equalizing control if the logical level of the write data DQ at hand is the same as that of the write data DQ directly following it.

FIG. 11 depicts a timing chart showing an example operation of the semiconductor device 3 of the subject exemplary embodiment.

Referring to FIG. 11, it may be seen that, during the period since a time point T21 until a time point T22, neither the pre-charge control nor the equalizing control is executed. In like manner, neither the pre-charge control nor the equalizing control is executed during the period since a time point T24 until a time point T25 as well.

In the above periods, the write operation for write data DQ of the H level or that for write data DQ of the L level is sustained. Since the comparison result signal DRWBSB5 is at the H level, the equalizing control is not performed. On the other hand, if the write data DQ is changed from the H level to the L level, the comparison result signal DRWBSB5 at a time point T23 shifts to the L level, as a result of which the equalizing control is performed.

That is, during the consecutive write operations in the semiconductor device 1 of the subject exemplary embodiment, the logical level of the write data DQ at hand is compared to that of the next following write data DQ. Based on the result of comparison, it is determined whether or not equalizing control is necessary. That is, if the logical levels of the above two write data coincide with each other, the equalizing control is halted, as a result of which it is possible to reduce the charge/discharge current on the pair main input/output lines MIOT, MIOB to lesser values.

In the exemplary embodiments 1 through to 3, it has been assumed that the semiconductor devices 1 to 3 operate as the DDR3-SDRAMs, but not with the intention to limit the semiconductor devices 1 to 3 to the DDR3-SDRAMs. It is only sufficient that the semiconductor devices 1 to 3 are such semiconductor devices that exercise pre-charge control as well as equalizing control for the signal input/output lines.

The disclosures of known technical literatures, including the above indicated Patent Literature, are to be incorporated herein by reference. The particular exemplary embodiments or examples may be modified or adjusted within the gamut of the entire disclosure of the present invention, inclusive of claims, based on the fundamental technical concept of the invention. Moreover, a variety of combinations or selection of elements herein disclosed, inclusive of various elements of the claims, exemplary embodiments, Examples or figures, may be made within the concept of the claims. It is to be understood that the present invention may include a variety of changes or corrections that may occur to those skilled in the art in accordance with the total disclosures inclusive of the claims and the technical concept of the invention. In particular, if the ranges of numerical values are stated herein, they should be construed as indicating any optional numerical values or sub-ranges comprised within the ranges stated even if such purport is not mentioned explicitly.

What is claimed is:

1. A semiconductor device, comprising:
    an I/O line pair composed by a first I/O line and a second I/O line;
    a precharge circuit provided between the first and second I/O lines to pre-charge the first and second I/O lines to a first potential in response to a first control signal;
    an equalizing circuit provided between the first and second I/O lines to short-circuit the first and second I/O lines in response to a second control signal; and
    a control circuit generating the first and second control signals independently of each other to control the precharge circuit and the equalizing circuit independently of each other to activate one of the precharge circuit and the equalizing circuit and not the other of the precharge circuit and equalizing circuit when a plurality of data write operations occur in succession, wherein, when the plurality of data write operations occur in succession, the control circuit prevents precharge of the first I/O line and the second I/O line between consecutive data write operations of the plurality of data write operations.

2. The semiconductor device according to claim 1, wherein, the I/O line pair is coupled to a memory cell.

3. The semiconductor device according to claim 2, wherein,
in doing a write operation for the memory cell, the control circuit generates the first and second control signals independently of each other.

4. The semiconductor device according to claim 2, wherein,
the memory cell comprises a DRAM memory cell.

5. The semiconductor device according to claim 4, wherein,
during a time interval when a burst write signal indicating a plurality of consecutive data write operations is entered, the control circuit generates the first control signal, without generating the second control signal, at a time point between a specified one and the next following one of the plurality of the consecutive data write operations.

6. The semiconductor device according to claim 5, wherein,
when a data mask signal for not performing the specified data write operation is entered, the control circuit generates the first control signal and the second control signal at a time point between the specified data write operation and the next following data write operation in the course of the consecutive data write operations.

7. The semiconductor device according to claim 1, wherein,
the precharge circuit includes a first transistor of one conductivity type and a second transistor of the one conductivity type; the first transistor being coupled between the first I/O line and a first power supply line supplying the first potential and having a control teiminal fed with the first control signal; the second transistor being coupled between the second I/O line and the first power supply line and having a control terminal fed with the first control signal;
the equalizing circuit including a third transistor of a second conductivity type and a fourth transistor of the one conductivity type; the third transistor being coupled between the first I/O line and the second I/O line and having a control terminal fed with a signal derived from the second control signal; the fourth transistor being coupled between the first I/O line and the second I/O line and having a control terminal fed with a signal derived from the second control signal.

8. A semiconductor device, comprising:
a word line;
a bit line pair;
a memory cell formed at least one of intersections of the word line and two bit lines of the bit line pair;
a local I/O line pair disposed to intersect the bit line pair;
a main I/O line pair disposed to intersect the local I/O line pair;
a first transistor of one conductivity type coupled between the first I/O line and a first power supply line and having a control terminal coupled to a first control line;
a second transistor of the one conductivity type coupled between the first power supply line and the second I/O line and having a control terminal coupled to the first control line;
a third transistor of the one conductivity type coupled between the first I/O line and the second I/O line and having a control terminal coupled to a second control line different from the first control line; and
a fourth transistor of a second conductivity type coupled between the first I/O line and the second I/O line and having a control terminal coupled to the second control line
wherein the first and second transistors are configured to precharge the main I/O line pair, wherein, when a plurality of data write operations occur in succession, the main I/O line pair are not precharged between consecutive data write operations of the plurality of data write operations.

9. The semiconductor device according to claim 8, wherein,
one of the third and the fourth transistors has a control terminal coupled via an inverter to the second control line.

10. The semiconductor device according to claim 8, wherein,
the memory cell comprises a DRAM memory cell.

11. A semiconductor device, comprising:
an equalizing circuit performing pre-charge which pre-charges a signal input/output line pair, used for inputting/ outputting data, to a first potential, and equalization which short-circuits the signal input/output line pair, independently of each other, wherein pre-charge control and equalizing control are separated from each other; and
a control circuit which, in case a plurality of write operations occur in succession, allows the equalizing control in the equalizing circuit to short-circuit the signal input/output line pair and halts the pre-charge control in the equalizing circuit to prevent pre-charge of the signal input/output line pair between consecutive data write operations of the plurality of write operations.

12. The semiconductor device according to claim 11, wherein,
in case a plurality of write operations occur in succession, the control circuit manages the equalizing control in the equalizing circuit at a time point between a preset write operation and the next following write operation in the course of the consecutive write operations.

13. The semiconductor device according to claim 12, wherein,
in case data masking is executed for write data, the control circuit manages the pre-charge control and the equalizing control in the equalizing circuit at a time point between a preset write operation and the next following write operation in the course of the consecutive write operations.

14. The semiconductor device according to claim 11, wherein,
the control circuit decides executing data masking for write data on the bit-by-bit basis and decides whether or not the pre-charge control is to be performed in the equalizing circuit based on the result of the bit-by-bit decision.

15. The semiconductor device according to claim 11, wherein, the control circuit compares a logical level of a first write data to that of a second write data directly before the first write data and, based on the result of comparison, decides whether or not it is necessary to perform the equalizing control in the equalizing circuit.

16. The semiconductor device according to claim 15, wherein,
in case the logical level of the first write data coincides with that of the second write data, the control circuit halts the pre-charge control and the equalizing control in the equalizing circuit;
the control circuit in case of non-coincidence of the logical level of the first write data with that of the second write data halting the pre-charge control and executing the equalizing control in the equalizing circuit.

* * * * *